United States Patent [19]

Schneider

[11] 4,058,826
[45] Nov. 15, 1977

[54] METHOD AND SYSTEM FOR GENERATING OSCILLOGRAPHIC DISPLAYS OF ANALOG SIGNALS UPON A TV

[76] Inventor: Seymour Schneider, 27 Collamore Terrace, West Orange, N.J. 07052

[21] Appl. No.: 677,432

[22] Filed: Apr. 15, 1976

[51] Int. Cl.$^2$ .............................................. H04N 9/62
[52] U.S. Cl. ....................................... 358/10; 324/88; 358/139
[58] Field of Search .................... 178/DIG. 4; 358/10, 358/139; 324/88

[56] References Cited

U.S. PATENT DOCUMENTS 3,337,684  8/1967  Sadler ................................. 358/139

OTHER PUBLICATIONS

Southworth, Journal of the SMPTE vol. 75, pp. 848–850, Sept. 1966.

Southworth, Radio & TV News, pp. 66–67, 158, Apr., 1958.

Primary Examiner—Robert L. Richardson
Attorney, Agent, or Firm—Eugene Lieberstein

[57] ABSTRACT

An oscillographic display of at least one input signal which is of arbitrary period or is aperiodic may be generated upon a standard television receiver by storing the input signal in a storage medium containing a multiplicity of storage elements and triggering the storage in synchronism with the input signal. The rate of storage of the input signal is controlled independent of the input signal rate. The stored input signal is thereafter read out at a time rate synchronized to the horizontal synchronization frequency of the television receiver and converted into compatible video signals for display. Adjustment of the rate of storage of the input signal provides a corresponding change in time scale in the displayed input signal. Color labeling and a background color is provided as well as a graticule.

16 Claims, 13 Drawing Figures

SYSTEM CLOCK RATES

FIG. 11

METHOD AND SYSTEM FOR GENERATING OSCILLOGRAPHIC DISPLAYS OF ANALOG SIGNALS UPON A TV

This invention relates to a method and system for generating oscillographic displays of analog signals on a standard television receiver. For purposes of the present invention a standard television receiver is intended to include any receiver whose display is generated by a raster scan intensity modulated signal.

Accepted standards in the United States for a television receiver require 525 lines to be allocated to each picture frame, a horizontal scanning rate of exactly 15,750 times a second and a fixed picture area vertical scanning rate of 60 times a second. The incoming video signals are used to control the luminance of the display for black and white reception and the luminance and chrominance of the display for color reception. Accordingly, the displayed image is not intended to nor does it provide a real time correspondence with the transmitted video signal.

Contrary to a television receiver, the principle operation of an oscilloscope is to provide a display in real time of an input waveform signal; i.e., the image on the screen should not only be a visual replica of the waveform of the input signal, except for scale changes, but also bear an accurate time relationship to the input signal. For an oscilloscope to be useful one of its axes, preferably the horizontal, must be linearly related to time and should have applied thereto a sweep signal waveform capable of accurate synchronization to the input signal so that the input signal whether periodic or aperiodic will be displayed as a stationary signal for observation test and measurement.

Because of the general availability of the standard television receiver it would be useful to display analog signals in real time on the display of a standard receiver without modification particularly for physiological and biological testing, diagnosis and measurement as well as for electronic electrical tests and measurement. For example, such a display would permit observation and monitoring of physiological signals from an individual in a location other than a research or medical facility. Heretofore, television receivers have been used to display information in the form of alphanumerics, symbols and graphical bars. Television receivers have also been used for displaying numerical information from digital data upon conversion to compatible video signal information.

The method and system of the present invention permits analog signals to be displayed in real time on a standard television receiver. In accordance with the present invention, the input analog signal to be displayed is sampled to produce a predetermined number of sampled signals with the magnitude of each of the individual sampled signals representing the magnitude of the analog signal at a particular point in time. The sampling rate is adjustable and independent of the time period of the analog input signal. The sampling operation may be initiated at any point in time with reference to the period of the input signal preferably by means of an adjustable trigger sweep. Control over the sampling operation will permit observation and examination of a wide range of waveforms and examination of any selected portion of any one or more cycles of the analog input signal. Video signals are generated from the sampled signals at a rate compatible with the raster synchronization rate of a standard television receiver and from which video compatible television signals are derived. Since the video signals bear an accurate time and sequence correspondence with the sampled signals, the displayed image will bear an accurate real time relationship to the analog signal. In addition, the present invention permits multiple displays on the same television receiver screen and in separate colors where a color television receiver is available. A reference graticule may also be generated to facilitate relative time and level comparisons between portions of a single signal and between multiple input analog signals.

Accordingly, it is the principle object of the present invention to provide a method and system for generating oscillograph displays of analog signals on a standard television receiver.

It is another object of the present invention to provide a method and system for displaying multiple analog signals simultaneously on the standard television receiver.

It is yet another object of the present invention to provide a method and system for displaying a background electronic graticule on the standard television receiver for monitoring and measuring displayed analog signals.

It is still another object of the present invention to provide a self-contained television oscilloscope incorporating a standard television receiver and means for generating multiple oscillographic displays in response to multiple analog input signals.

Other objects and advantages of the present invention will become apparent from the following detailed description of the invention when read in connection with the accompanying drawings in which.

Figure 1:
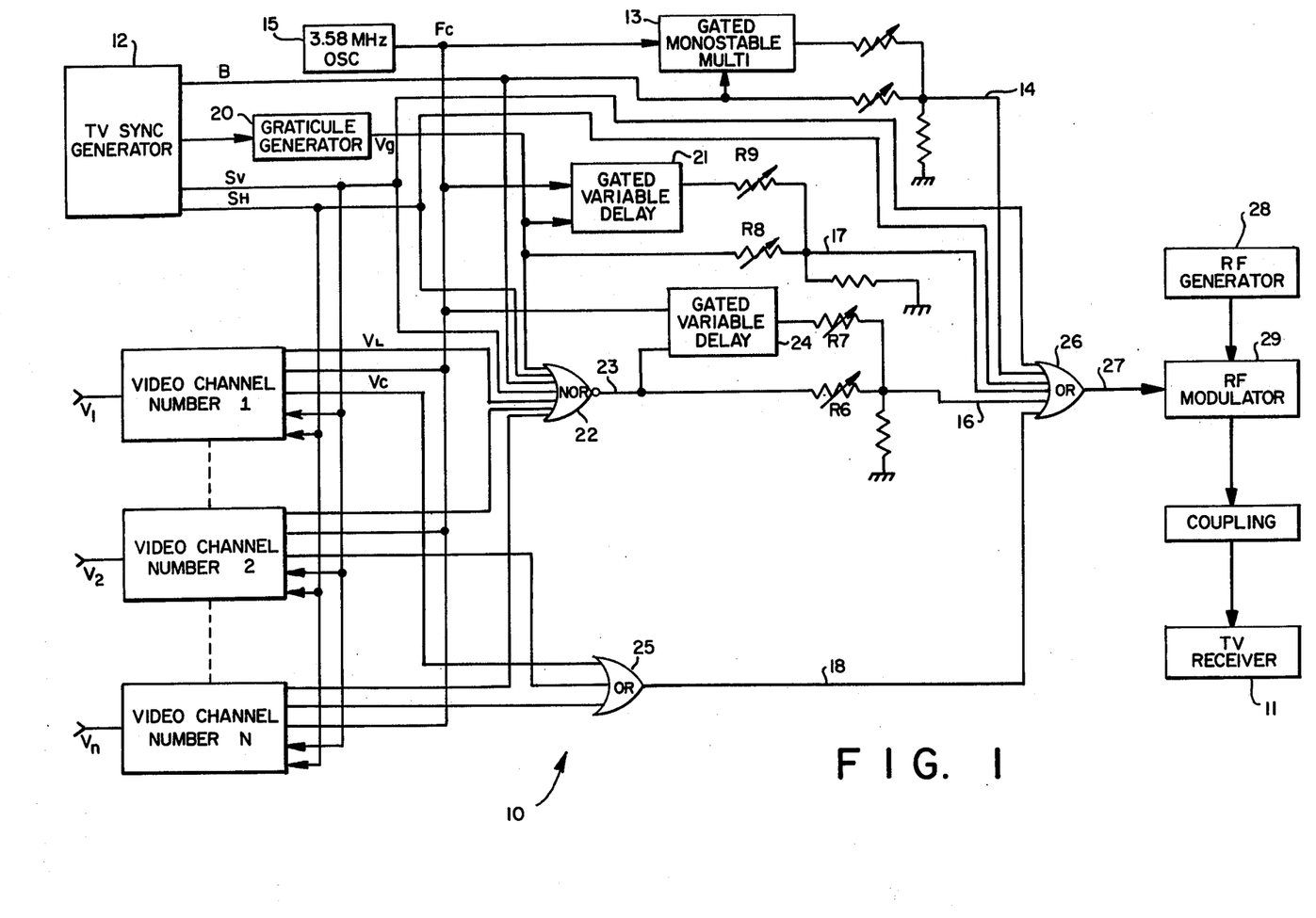
FIG. 1 is a general block diagram of the television oscillographic display system of the present invention.

Referring now to FIG. 1 showing the block diagram of the system 10 for generating multiple color trace displays upon a standard color television receiver 11 from corresponding multiple analog input signals. It should be understood that although a color display is preferred the system is readily simplified to generate video signals for a display in black and white only. Moreover, if the television receiver is monochromatic the display can only appear in black and white and will disregard the transmission of chrominance information. A video channel of from 1-N is provided for each of a corresponding number of input analog signals $V_1$-$V_n$ respectively. The actual number of video channels to be provided in any given system will depend upon the specific application of the system. The video channels 1-N are identical to one another with each generating a video and video color output signal $V_1$ and $V_c$ in response to each of the input signals $V_1$-$V_n$ respectively as will be explained in greater detail in connection with FIG. 2. In addition to the video and video color signals, other signals are generated to form compatible video color transmitting signals for television reception and to permit adjustment and control over the hue and saturation and brightness of the color transmitting signals as well as to provide a background color. Such other signals as are pertinent to the present invention include: vertical synchronization pulses, horizontal synchronization pulses, a background color signal, a color reference signal and timing signals. The video synchronization pulses, and the timing signals are generated from a conventional television synchronization generator 12 which is available as a signal integrated circuit solid state chip such as for example, a National MM 4320.

In addition to generating television compatible video color signals the present system provides for the generation of a graticule upon the screen in the form of a cross-hatched pattern of calibration lines in both the vertical and horizontal directions. The video signals $V_g$ forming the graticule are generated by the graticule generator 20. The color of the graticule generator video signals $V_g$ are controlled by the gated variable delay circuit 21. The graticule generator 20 is shown in more detail in FIG. 10, and will be elaborated upon in greater detail further in the specification. It is, however, to be understood that any graticule generating system may be used.

Figure 10:
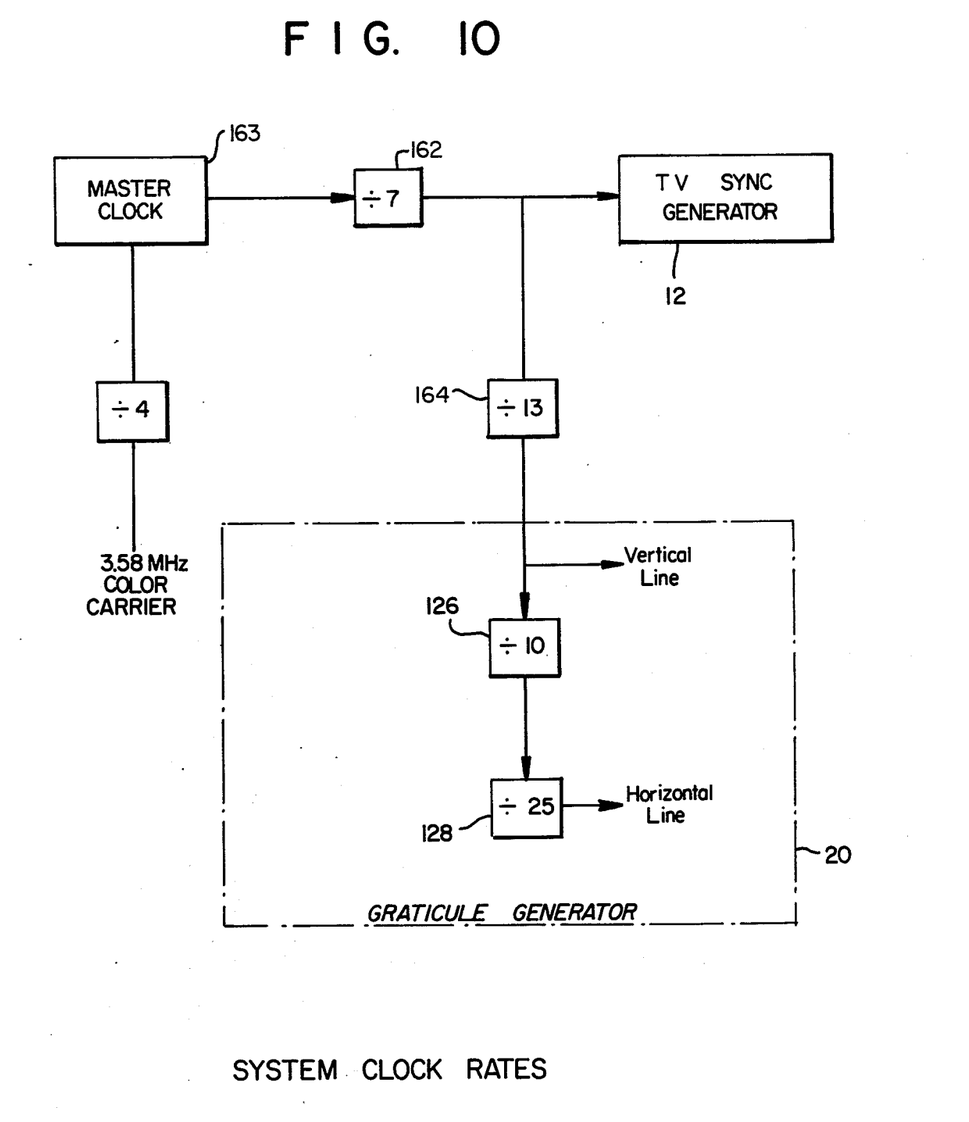
FIG. 10 is a circuit schematic of the graticule generator of the present invention.

A color burst reference signal 14 is generated by gating a 3.58 MHz fixed frequency chrominance subcarrier oscillating signal Fc supplied from a conventional crystal oscillator 15. A 3.58 megacycle (MHz) subcarrier frequency Fc can also be generated starting from a master clock oscillator of 14.318 MHz and then dividing by four using a conventional frequency divider as is shown in FIG. 10. Gating is preferably accomplished by passing the fixed frequency subcarrier signal Fc through a conventional monostable multivibrator circuit 13 which is enabled by a color burst sync signal B generated from the television synchronization generator 12. The monostable multivibrator period is of short duration allowing it to follow the 3.58 MHz signal. Signal B enables the multivibrator for the required number of cycles of the chrominance subcarrier Fc to form the color burst signal 14.

A color background signal 15 is generated to form a background color raster in that region of the display where the graticule signals and the video signals from the video channels 1-N are not present. The video signal outputs $V_L$ from the video channels in combination with the color burst sync signal B, the horizontal and vertical sync outputs from the television synchronization generator 12, and the video output signals $V_g$ of the graticule generator 20, are applied to a conventional NOR gate 22. The logical output 23 of NOR gate 22 will be low during the occurence of any of the input signals thereto and high during the absence of all input signals. The background color signal 16 is derived from the output 23 of the NOR gate 22 in conjunction with the output from the gated variable delay circuit 24.

The video color signals $V_c$ generated from the video channels 1-N are all simultaneously applied to an OR circuit 25 which provides an output 18 coincident with any of the applied video color input signals $V_c$. The output 18 from OR circuit 25 is applied to the input of OR circuit 26 in combination with the color reference signal 14, the graticule color signal 17, the background color signal 16, and the horizontal and vertical sync signals $S_h$ and $S_v$ respectively.

The combined video output information 27 from OR circuit 26 is modulated onto an RF carrier signal by means of a conventional radio frequency (RF) modulator 29. The RF carrier signal is generated from a conventional RF oscillator 28. The modulated carrier output may be transmitted to the standard television receiver 11 by a direct coupling to the antenna using standard antenna wire or by radiation from a transmitting antenna to the receiving antenna. Alternatively and instead of a remote operation it is within the scope of the present invention to combine a standard TV receiver system with the present system for forming a self-contained TV oscilloscope. In such case, the combined video output information 27 from OR circuit 26 would be directly applied to the color demodulation circuitry of a conventional receiver system and with the horizontal and vertical sync signals directly applied to the horizontal and vertical deflection circuits of such receiver system.

Each input signal $V_1$-$V_n$ is displayed simultaneously on the screen of the television receiver 11 with the amplitude axis in the horizontal direction and the time axis in the vertical direction. If it is desired to view the display in the more traditional mode with the horizontal axis representing time, the receiver may be readily oriented 90° from its normal viewing position or alternatively the deflection assembly within the receiver itself can be rotated ninety degrees. It should be understood that although the signals are displayed simultaneously they are completely independent of each other and do not form a composite signal. Each display may however overlap on the screen of the television receiver. However, by shifting one display relative to another each may be varied so as to position each display at a different location along the amplitude axis upon the screen. Although position controls for shifting displays relative to one another is not shown it should be understood that this may simply be accomplished by introducing an offset DC voltage into the input signal amplifier. Moreover, the color and amplitude scale of each signal can be varied as will be hereafter explained to further differentiate the displays from one another. The generated graticule permits accurate real time measurement of each of the displayed signals.

Figure 2:
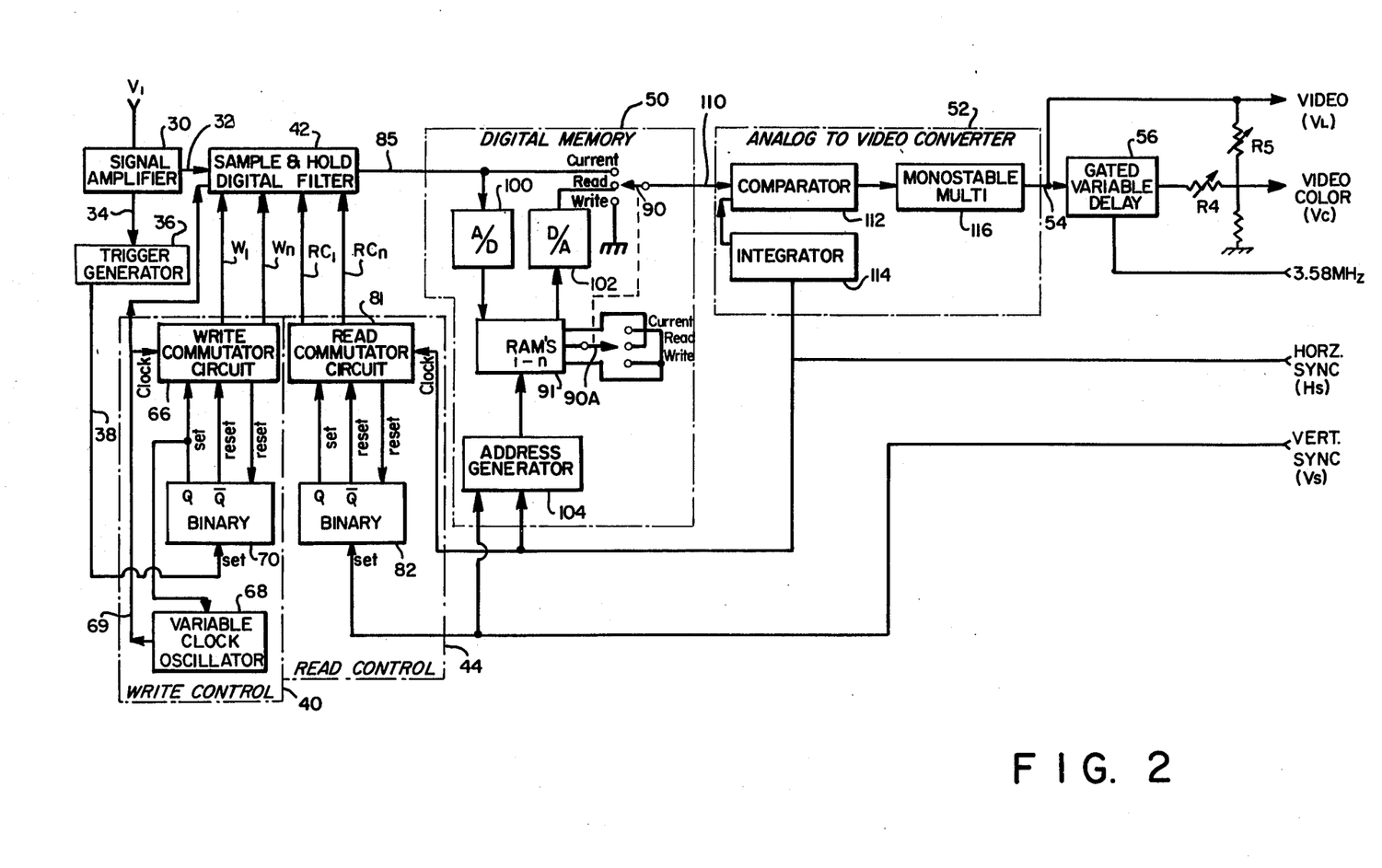
FIG. 2 is a general schematic diagram of one of the multiple video channels of FIG. 1.

A detailed block diagram of each video channel 1-N is shown in FIG. 2. An input analog signal $V_1$ is applied to the signal amplifier 30 which provides an amplified analog signal 32 and a similar amplified analog signal 34. The amplified analog signal 34 is applied to the trigger generator 36. The trigger generator 36 produces an output trigger pulse 38 which may be adjusted in time relative to the amplified analog signal such that the occurrence of the trigger pulse may be related to any point within the time period of the analog signal as will be explained with reference to FIG. 3. The trigger pulse 38 is applied to a write control circuit 40. The amplified analog signal 32, variable clock signal 69 and the commutator outputs $W_1$-$W_n$ from the write control circuit 40 are applied to a sample and hold digital filter circuit 42. The sample and hold digital filter 42 will sample the amplified analog input signal 32 in response to the commutator outputs from the write control circuit 40 to produce a series of sampled signals with the magnitude of any individual sampled signal representing the magnitude of the analog signal at a particular moment in time. Each individual sampled signal is stored in the sample and hold circuit 42. The sampling rate is controlled by the write control circuit 40 and is adjustable. The number of sampled signals stored in the sample and hold digital filter 42 is fixed for any given system and corresponds in a predetermined relationship to the output read signals from the read control circuit 44 as will be more fully explained hereafter. If a recurrent input analog signal is applied to a video channel it may be resampled continuously. Moreover, by adjustment of the sampling rate via the variable clock rate, the display of any predetermined portion of any one or more than one cycle of the analog input signal may be adjustably varied. The sampling period is initiated with the occurrence of a trigger pulse from the trigger generator 36.

The sampled signals stored in the sample and hold digital filter 42 may be retransmitted to a digital memory 50 for indefinite storage or applied to the analog to video converter 52 for conversion to television video signals $V_L$ on line 54 in response to the read control circuit 44. The video signals $V_L$ on line 54 are converted to video compatible color television signals $V_c$ by the gated variable delay circuit 56.

Figure 3:
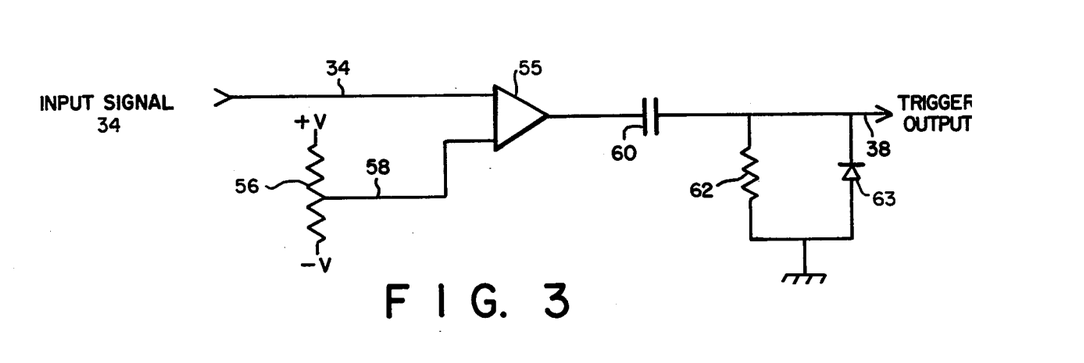
FIG. 3 is a circuit diagram of the trigger generator of FIG. 2.

Referring now to FIG. 3 in which the trigger generator 36 is shown comprising a high gain differential amplifier 55 which is used to compare the amplified analog input signal 34 with an adjustable DC reference voltage level 58. The DC reference level 58 is generated from a variable potentiometer 56. A positive and negative voltage is connected respectively across the potentiometer 56 for providing adjustment over the polarity of level 58. When the magnitude of the input signal 34 is less than the adjusted DC reference level 58 the output from the difference amplifier 55 is negative and when the input signal 34 is larger than the adjusted DC reference level 58 the output of the difference amplifier 55 is positive. As the input signal varies from less than to greater than the adjusted DC reference level 58, the difference amplifier output makes a fast transition from negative to positive. Similarly, as the input signal 34 varies from greater than to less than the adjusted DC reference level 58, the difference amplifier output makes a fast transition from positive to negative. The combination of capacitor 60 and resistor 62 forms a differentiating circuit which produces alternate positive and negative pulses. The negative pulses are shorted by diode 63 leaving only positive trigger pulses on line 38. The positive pulses occur whenever the input signal 34 to the trigger generator 36 passes through a value equal to the adjusted DC reference level 58 of the variable potentiometer 56. Adjustment of the DC reference level 58 will shift the occurrence of the trigger pulse to any desired point on the analog input signal waveform.

Figure 4:
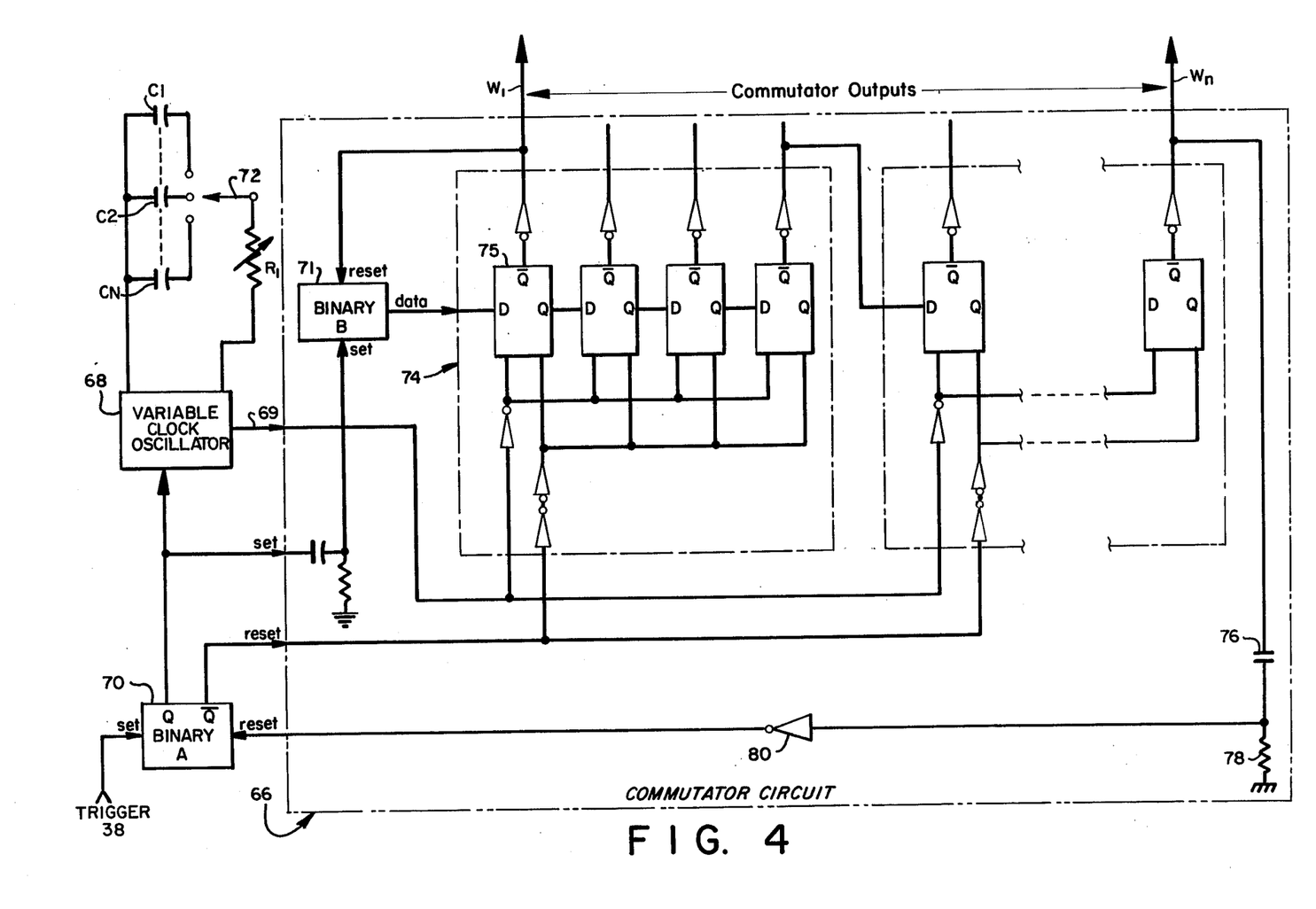
FIG. 4 is a circuit schematic diagram of the write commutator circuit of FIG. 2.

The write control circuit 40, as is shown in FIGS. 2 and 4 inclusive, includes a write commutator circuit 66, an adjustable frequency oscillator 68 and a binary flip-flop 70. The write commutator circuit 66 is composed of a binary flip-flop 71 and a multiple stage static shift register 74 preferably formed from conventional shift registers such as the RCA CD 4015. The binary flip-flops are conventional RS flip-flops. The adjustable frequency oscillator 68 is a conventional relaxation oscillator which generates an output frequency clock signal 69 with a frequency determined by the position of switch 72 in combination with the setting of variable resistor R1. Switch 72 selects the timing capacitor from capacitors $C_1$-$C_N$ and thus controls the RC time constant which in turn determines the frequency of oscillation. The number of stages of the static shift register 74 corresponds to the number of stored control signals in the sample and hold digital filter 42. The output from each stage equals one of the write commutator circuit outputs $W_1$-$W_n$ respectively.

The write control circuit 40 is enabled by the trigger output pulse 38 from the trigger generator 36. The trigger pulse 38 sets binary flip-flop 70 and enables the adjustable frequency oscillator 68. Binary flip-flop 71 is set when the differentiated output of binary flip-flop 70 becomes true and is reset by the output from the first stage 75 of the shift register 74 permitting only one logical high to be propagated through the register 74. Oscillator 68 provides clock pulses 69 which are timed into the static shift register 74 such that each succeeding clock pulse shifts the logical high output from each stage to the next higher stage of the register. When a clock pulse shifts the last stage of the register, its ouput transition from high to low is differentiated by the combination of capacitor 76 and resistor 78 and inverted by inverter 80 to a positive reset pulse. The positive reset pulse, resets binary flip-flop 70 which in turn disables the oscillator 68 and clears the static shift register 74. The next trigger pulse to binary flip-flop 70 will cause the write control sequence to repeat itself.

Figure 5:
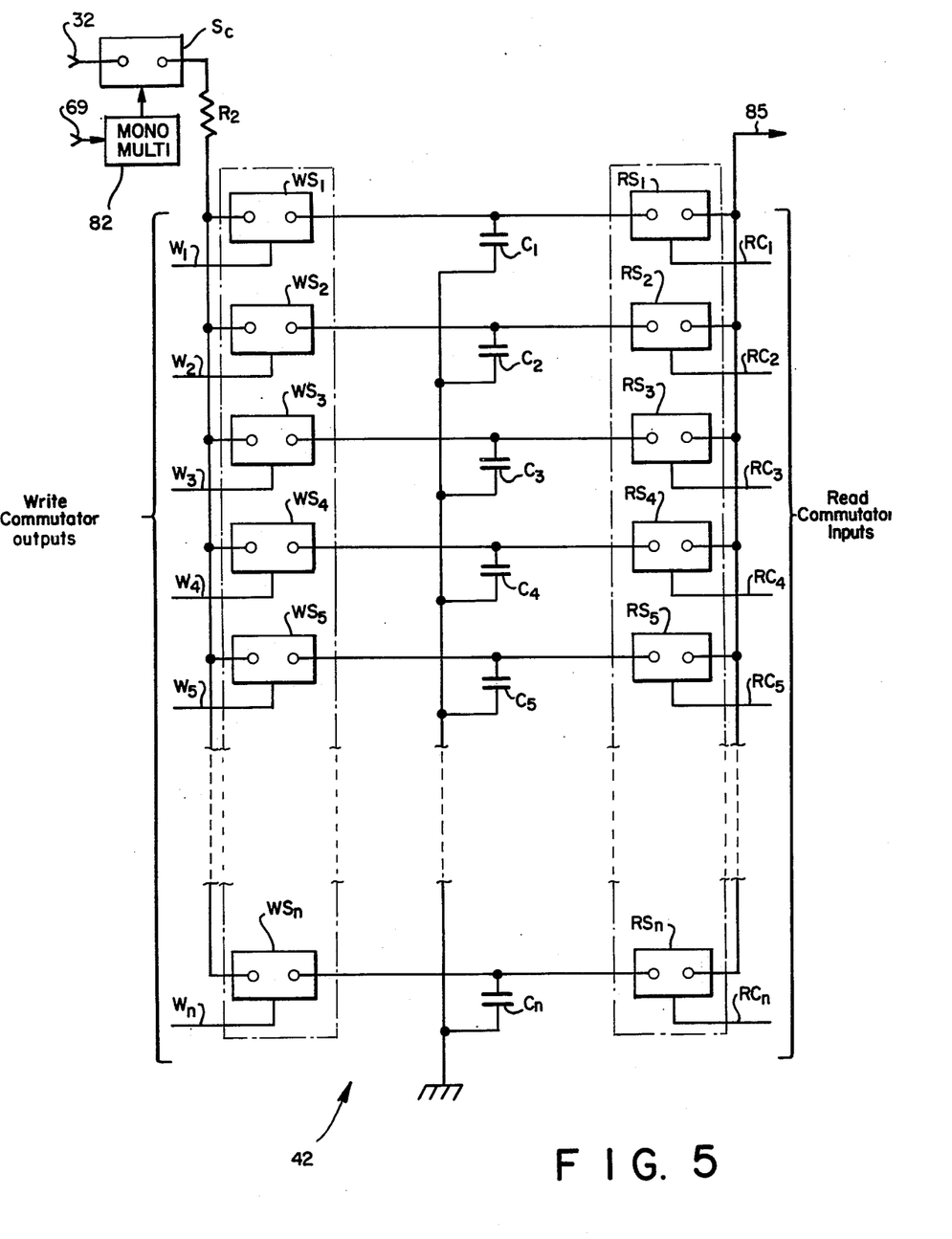
FIG. 5 is a circuit schematic of the sample and hold digital filter of FIG. 2.

The sample and hold digital filter circuit 42 is shown in FIG. 5 consisting of a sampling input control switch $S_c$, a series resistor R, a first multiplicity of solid state write switching elements $WS_1$-$WS_n$, a corresponding multiplicity of storage capacitors $C_1$-$C_n$; and a second multiplicity of solid state read switching elements $RS_1$-$RS_n$. Each write and read solid state switching element is symbolically shown and is representative of a fast acting field effect transistor switch such as a CD 4016A available from RCA. Each switching element $WS_1$-$WS_n$ is connected in series to a corresponding capacitor $C_1$-$C_n$ with each series combination interconnected in parallel to each other and having one common end at ground potential and the opposite common end connected to the series combination of sampling input control switch $S_c$ and resistor R. Likewise, each read switch $RS_1$-$RS_n$ respectively is connected in series circuit relationship with a corresponding storage capacitor $C_1$-$C_n$ respectively.

The commutator outputs $W_1$-$W_n$ of the write commutator circuit 66 are connected to the write switches $WS_1$-$WS_n$ of the sample and hold filter circuit 42. Accordingly, when a write commutator output is high the corresponding write switch to which it is electrically connected will be closed and conversely when the write commutator output is low the switch is open. The sampling input control switch $S_c$ is a solid state switching element equivalent to any of the write switches $WS_1$-$WS_n$ or read switches $RS_1$-$RS_n$ respectively. The sampling input control switch $S_c$ is also responsive to the output of the monostable multivibrator circuit 82 which is in turn driven by the output clock pulses 69 from the variable oscillator timing clock 68 in the write control circuit 40. The monostable multivibrator 82 generates a short pulse of a duration shorter than the write clock pulse period. Hence, the sampling input control switch is closed for a time period shorter than the period of the write clock 69. This is necessary so that each sampling of the input will provide a sampled signal of constant value which does not vary during the sampling period.

The write commutator circuit outputs $W_1$-$W_n$ cause each write switch $WS_1$-$WS_n$ respectively to be sequentially activated, with each switch remaining closed for a period no less than the sampling period and no longer than the clock period. A sampled signal is thus generated with each sampling of the input analog signal. Each sampled signal is stored in the capacitors $C_1$-$C_n$ in a sequence corresponding to the sampling sequence which in turn begins with the occurrence of the trigger pulse. The voltage stored upon each storage capacitor will be determined by the following: (1) the input signal voltage at each consecutive sampling; (2) the sampling period; (3) the value of the storage capacitance and (4) the value of the current limiting resistance $R_2$.

Where the product of $R_2$ and the storage capacitance is small, the stored control signal voltage will be equal to the value of the sampled signal voltage at the sampling time. For periodic signals, the RC product may be increased so that each sampling will not in itself charge the storage capacitor to the full sampled signal voltage. However, with repeated sampling of the input signal, the stored control signal voltage will eventually equal the true sampled signal value. By selecting various values of R for any given value of storage capacitance, the time required to stabilize to the true sampled signal voltage can be varied. The effect of increasing the stabilizing time is to perform an averaging sampling operation on the input signal. This will cause all spurious and random input signals to be averaged to zero thereby increasing the signal to noise ratio of the stored signal compared to the signals present at the input.

In order to achieve effective storage of a control signal upon each of the storage capacitors $C_1$-$C_n$ respectively, the leakage resistance of each write switch $WS_1$-$WS_n$ and that of the input control switch $S_c$ must be very high. In addition, the leakage resistance of each read switch $RS_1$-$RS_n$ and the input impedance of the analog to video converter circuit 52 of FIG. 2 must likewise be very high so as to permit multiple readings of the stored control signals without discharging the storage capacitors $C_1$-$C_n$ respectively.

The stored control signals are read from the storage capacitors $C_1$-$C_n$ by sequential activation of the read switches $RS_1$-$RS_n$ respectively. It should be clear that, although the control signals may be derived by sampling the input signal at any desired rate it is essential when converting the control signals to video signals to synchronize the read frequency to the television picture scanning rate.

The read switches $RS_1$-$RS_n$ are closed in a sequence corresponding to the stored sequence for the control signals. Each read switch responds to a corresponding read commutator input signals $RC_1$-$RC_n$ generated from the read control circuit 44. The read control circuit 44 as shown in FIG. 2 comprises a read commutator circuit 81, which is identical to the write commutator circuit 66, and a binary RS flip-flop 82. The binary flip-flop 82 is controlled by a set signal corresponding in time to the television vertical synchronization signal generated from the television synchronization generator 12 of FIG. 1. A frequency clock signal corresponding to the television horizontal synchronization input from the television synchronization generator 12 operates to shift the register of the read commutator circuit 81 in the same manner that the shift register 74 of the write commutator circuit 66 is shifted but at the horizontal synchronization rate of a conventional television receiver. Thus, the read commutator circuit 81 is triggered at the vertical synchronization rate of the display receiver and the read switches $RS_1$-$RS_n$ sequentially read out the sampled signals stored by the storage capacitors $C_1$-$C_n$ respectively at the horizontal synchronization rate.

The sampled signals read out on line 85 from the sample and hold digital filter 42, are applied to the digital memory 50. The digital memory 50 includes a mode selector switch 90 and 90A which can be manually positioned to either a Current, Read or Write position respectively. In the current position the sampled signals are routed to both the analog to video converter 52 and the analog to digital converter 100. In addition switch 90A, which is ganged to switch 90 sets the RAM (91) in the write mode so that the digital memory is always storing the most recent data. With the mode selector switches 90 and 90A in the write position the sampled signals on line 85 are processed into digital signals by the digital memory 50 for permanent storage and retrieval while the input to the analog to video converter 52 is returned to ground causing no signal to be displayed from this video channel. The Read position of the mode selector switch 90 and 90A is used to retrieve the information stored by the digital memory 50.

Figure 6:
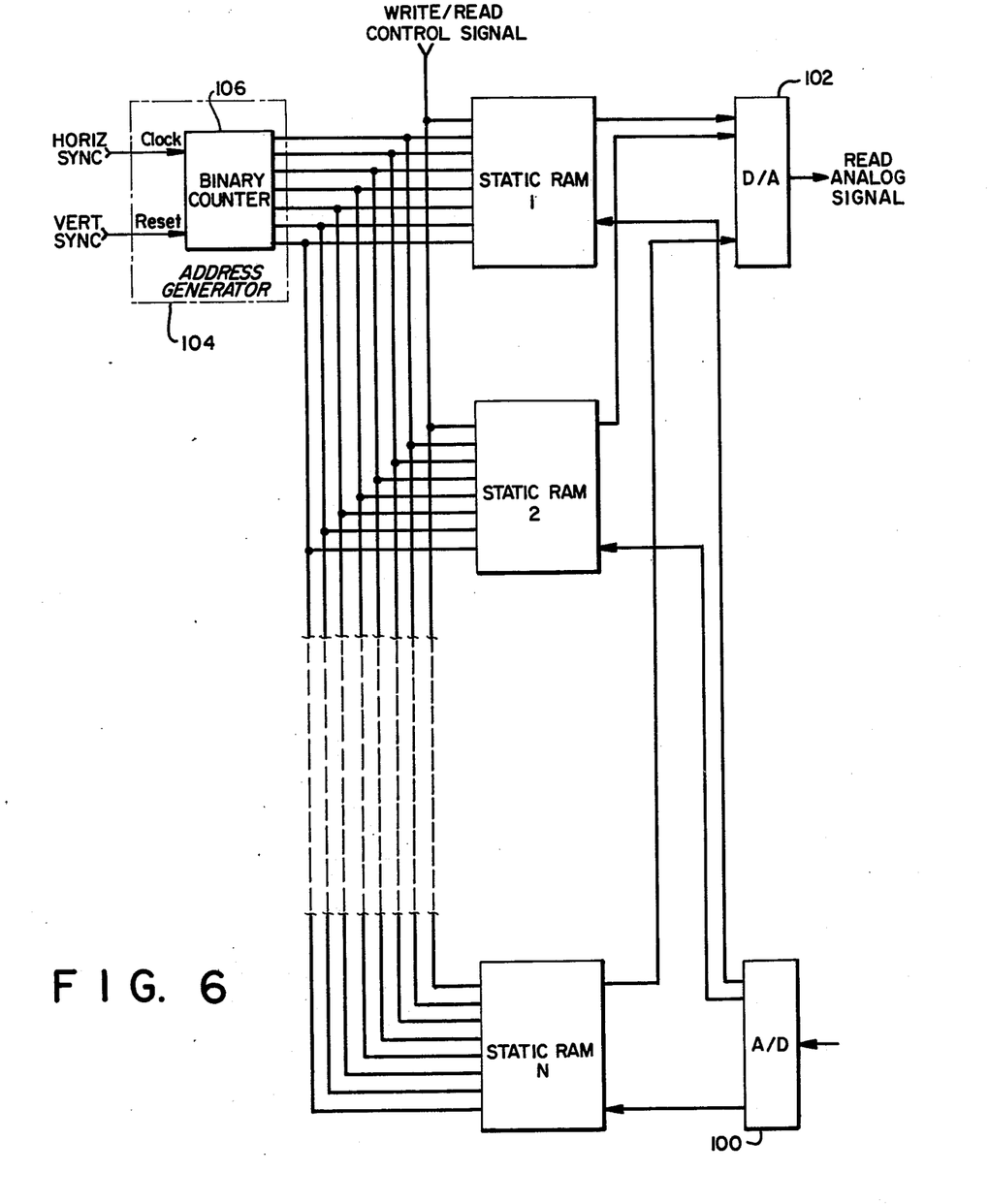
FIG. 6 is a more elaborate circuit diagram of the digital memory of FIG. 2.

The circuit block diagram for the digital memory 50 is shown in FIG. 2 and in more detail in FIG. 6. The circuit comprises an analog to digital converter 100, a digital to analog converter 102, an address generator 104 and a series of static random access memory integrated circuits $RAM_1$-$RAM_n$ respectively. The number of random access memory locations should preferably correspond to the number of read switching elements $RS_1$-$RS_n$ respectively. Each of the integrated circuits as shown in FIG. 6 is conventional and commercially available. For example, the analog to digital converter 100 is preferably a Burr Brown ADC85C, the digital to analog circuit 102 is preferably a Burr Brown DAC20 and each of the static random access memory circuits $RAM_1$-$RAM_n$ may be represented by an RCA CD4061A respectively. The analog to digital converter 100 converts the analog sampled signals read from the sample and hold digital filter 42 to corresponding digital signals each of which is stored in a static RAM at the address defined by the address generator 104. The address generator 104 consists of a conventional binary counter 106 which counts the horizontal sync pulses and generates a binary number which represents the address for each consecutive horizontal synchronization pulse. The vertical synchronization signal resets the binary counter 106 to zero and the counting begins again generating the series of addresses. All of the static RAMs are addressed to the same location at any instant of time so that the series of N static RAMs will result in a total random access memory containing a 256 word by N bit memory since each preferred random access memory contains a 256 word by 1 bit memory. With the mode selector switch 90 % 90A in the Read position, the sampled signals stored in digital form in each random access memory will be read out in synchronization with the horizontal synchronization pulses. The stored digital information is first reconverted back into analog sampled signals by the digital to analog converter 102 and thereafter presented on line 110 to the analog to video converter 52.

Figure 7:
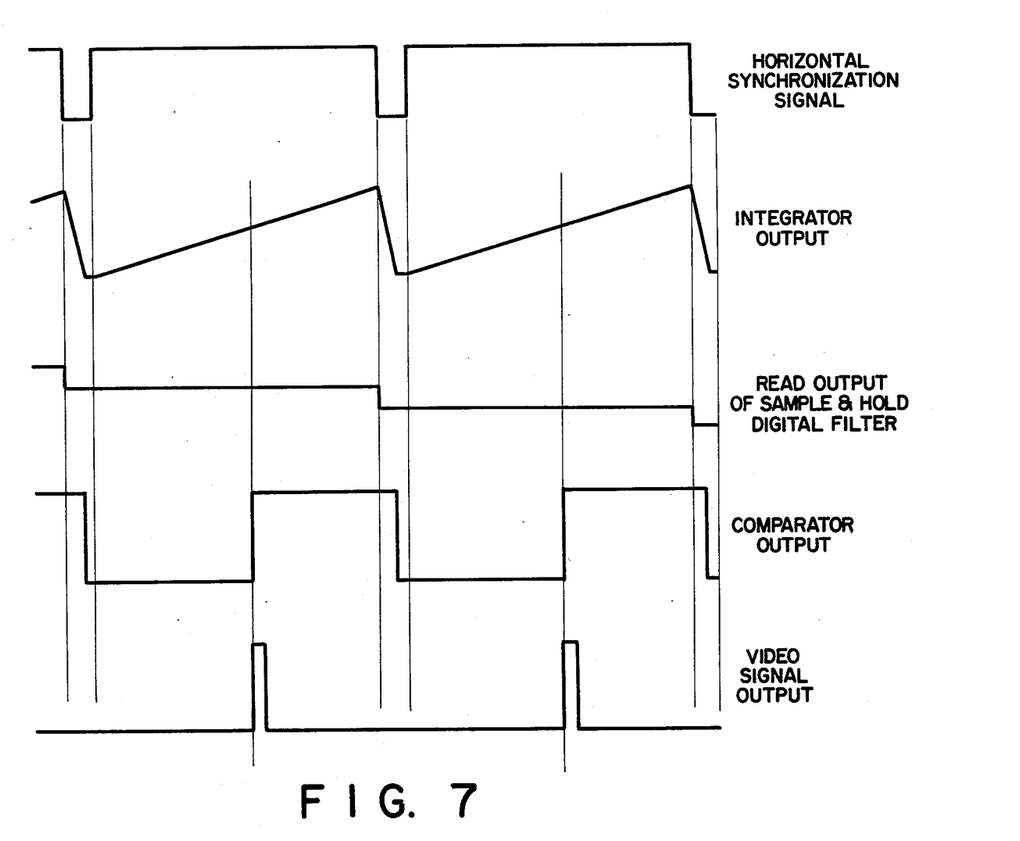
FIG. 7 illustrates the waveforms at the analog to video converter for generating video pulses.

The analog to video converter circuit 52 as illustrated in FIG. 2 comprises a comparator 112, an integrator 114 and a monostable multivibrator circuit 116. The integrator 114 is simply a sawtooth generator which generates a ramp signal that begins at the trailing edge of one horizontal synchronization pulse and terminates at the leading edge of the next synchronization pulse as is more clearly evident in FIG. 7. The peak-to-peak amplitude of the generated ramp signal has a range relative to the amplitude range for the stored sampled signals whether read directly from the sample and hold digital filter 42 or indirectly from the digital memory 50. Comparator 112 is responsive to the difference between the ramp signal and the applied sampled signal and will provide an output transition at the point of coincidence between the two input signals. Accordingly, the comparator 112 will provide an output transition for each stored sampled signal. The output of the comparator is used to trigger a monostable multivibrator which generates a narrow video pulse. This video pulse indicates the time position in the horizontal scan corresponding to the amplitude of the stored sampled signal voltage. Thus, a video pulse is generated for each stored sampled signal having a time position which corresponds to the amplitude of the stored sampled signal. Each video signal generated at the output of the analog to video converter 52 on line 54 is applied to the gated variable delay circuit 56 which is used to generate a corresponding video color signal $V_c$ and to provide color control.

Figure 8:
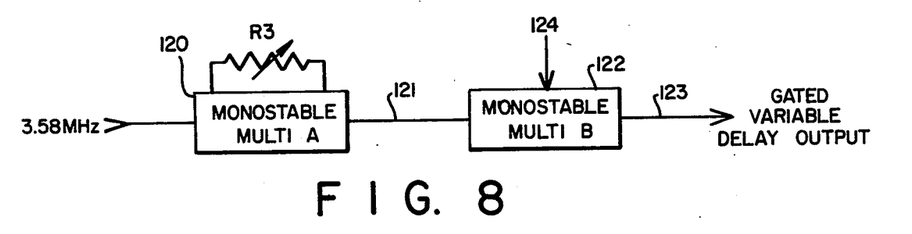
FIG. 8 is a circuit schematic of the gated variable delay circuit of the present invention.
Figure 9:
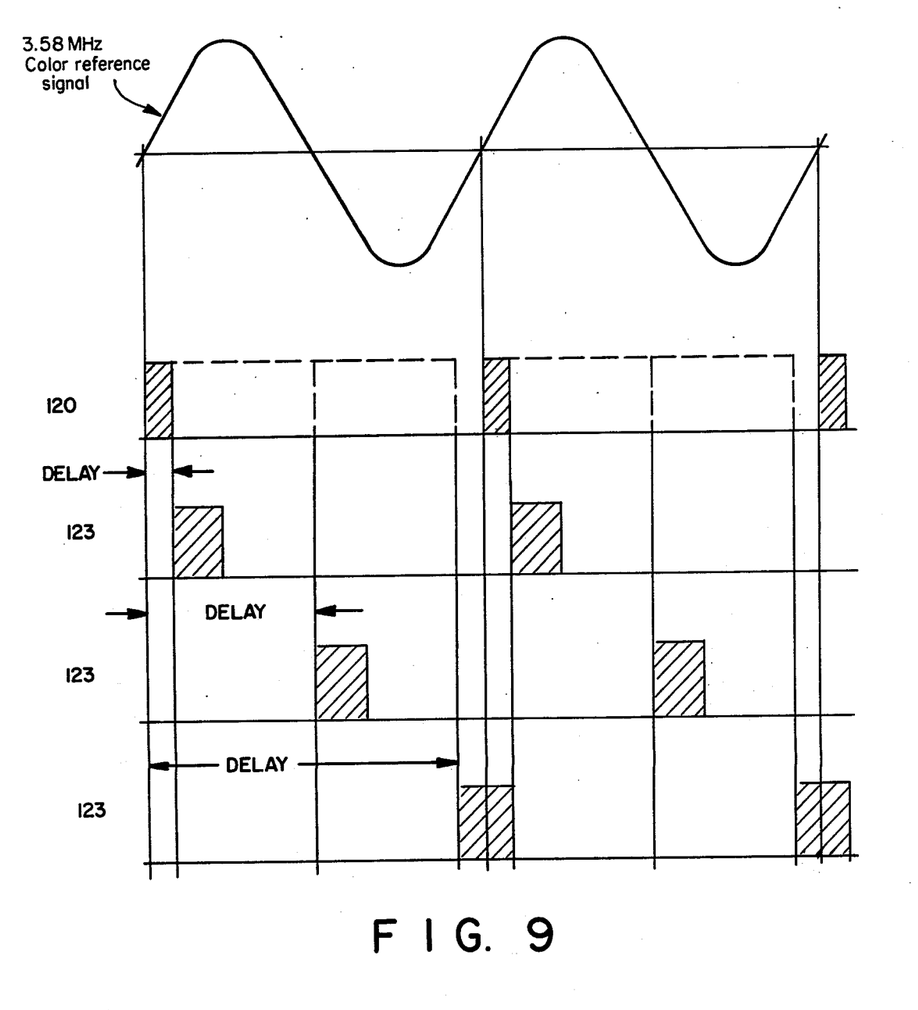
FIG. 9 shows the phase displacement of the output of the gated variable delay of FIG. 8 relative to an input color reference signal.

The gated variable delay 56 in FIG. 2 is functionally equivalent to the gated variable delay circuits 24 and 21 of FIG. 1. The gated variable delay circuits 56, 24 and 21 are used to generate the video color signals $V_c$, the background color signal 16, and the graticule color signals 17 respectively. Each of the variable delay circuits 56, 24 and 21 consists of two cascaded monostable multivibrators as is shown in FIG. 8. The first multivibrator 120 has a variable resistance control R3 for varying the duration of its pulse width. The trailing edge of its output 121 is used to trigger the second multivibrator 122 which is of fixed output pulse width. FIG. 9 indicates the relative phase displacement of the output 123 of the second multivibrator 122 with respect to the 3.58 MH$_z$ color input signal for different pulse width settings of control R3. It was assumed for simplicity in FIG. 9, that the first multivibrator 120 was triggered by the input 3.58 MH$_z$ signal at the instant of zero crossover. Hence, by adjusting variable resistor R3 the output 121 of multivibrator 120 is phase shifted with respect to the 3.58 MH$_z$ color input signal. This controls the hue of the color output signal 123 of monostable multivibrator 122. Accordingly, the output of each variable delay circuit 56, 24 and 31 will contain the chrominance information for the corresponding video signal $V_L$, the background signal 23 and the video graticule signal $V_g$ respectively.

It is equally important that each variable delay circuit 56, 24 and 21 provide a video color output only during the time interval when its corresponding video signal is to be displayed. This is assured by gating the second multivibrator 122 of each of the variable delay circuits 56, 24 and 21 respectively with a reset input 124. The reset input 124 is used to enable the second multivibrator 122 so that its output 123 is zero except when the gate signal is applied. The gate signal for each of the variable delay circuits 56, 24 and 21 is preferably the corresponding video signal $V_L$, the output 23 of NOR gate 22 and the output $V_g$ of the graticule generator 20 respectively.

The saturation or color perception for the video color output $V_c$ of gated variable delay 56 is adjusted by varying variable resistor R4 relative to variable resistor R5. Brightness can be controlled by simultaneous adjustment of R4 and R5 keeping their ratio constant. Likewise the saturation for the color background signal 16 and for the graticule color signal 17 may be varied by the relative adjustment of the combination of variable resistor R6 to variable resistor R7 and the combination of variable resistor R8 to variable resistor R9 respectively.

It should be understood, as indicated earlier, that a video color component is necessary only when a color receiver is available. Monochrome receivers contain no responsive color circuitry and are blind to the color subcarrier components as is well known.

When the system of the present invention is to be combined with a conventional display receiver to form an integral television oscilloscope the output 27, containing the video and color information for the input signals $V_1$-$V_n$ for each channel, the background color information and the graticule color information respectively, is directly coupled to the color demodulation circuits of the receiver for appropriate display of the input signals in accordance with the color assigned to each of them by control of the hue and saturation as explained heretofore.

The graticule or calibration lines are generated from the graticule generator 20 shown in FIG. 10. FIG. 10 also shows how some of the system clock signals may be derived using a master clock oscillator 163 of 14.31818 MH$_z$ (megacycles). For example, the 3.58 MH$_z$ color carrier $F_c$ may, as explained earlier, be derived from the master clock as opposed to using a separate crystal oscillator. The master clock output is divided first by 7 using frequency divider 162, and then using frequency divider 164, by 13 to provide a signal frequency of 157 KH$_z$ which is applied to the graticule generator 20. The 157 KH$_z$ signal forms the vertical line video output signal for the graticule generator 20 and since it is equal to 10 times the horizontal scan rate it will produce 10 bright spots for each horizontal scan. Viewing the entire raster of horizontal lines, these dots will appear as 10 vertical lines. The frequency divider 126 divides the 157 KH$_z$ signal by the number 10 to generate a frequency equal to the horizontal sync rate of 15.7 KH$_z$ which is then further divided by 25 through frequency divider 128 to generate a pulse for every 25 horizontal scans with a pulse duration equal to the time interval between horizontal zinc pulses. This produces the effect of a continuous bright spot or horizontal line at every twenty-five horizontal scan. The combination of the vertical and horizontal lines will produce a crosshatch pattern that is used as a graticule.

The video signals displayed on the receiver 11 is made up of a series of intensified or de-intensified dots. For certain analog input waveforms where there is discontinuity or rapid changes in signal amplitude such as a square wave of pulse signal there can exist considerable separation between the displayed dots of two successive sampled signals. In such instances the clarity of the display is considerably improved if successively displayed dots appear joined to one another in sequence. This also avoids confusion in the situation where there is unavoidable overlap of multiple displays.

Figure 11:
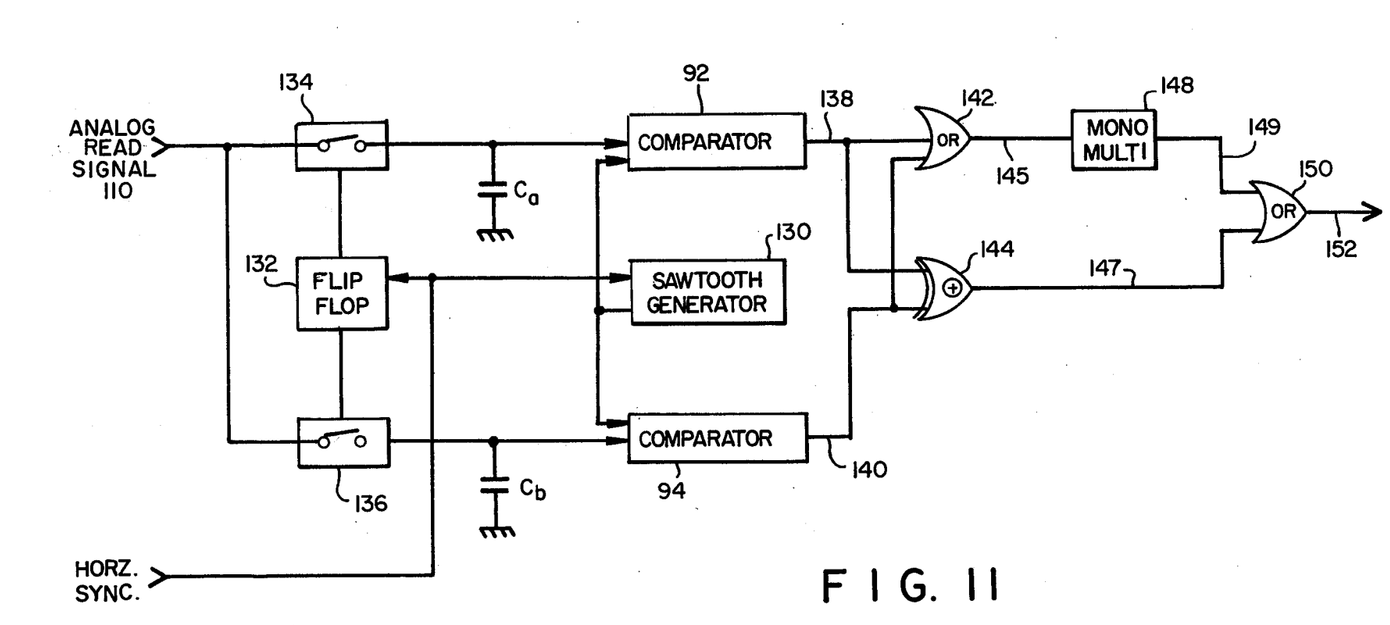
FIG. 11 is a circuit schematic of a continuous line output display in accordance with the present invention; and FIGS. (12a & 12b) illustrates the output waveforms for the continuous line output display circuit of FIG. 11.
Figure 12A:
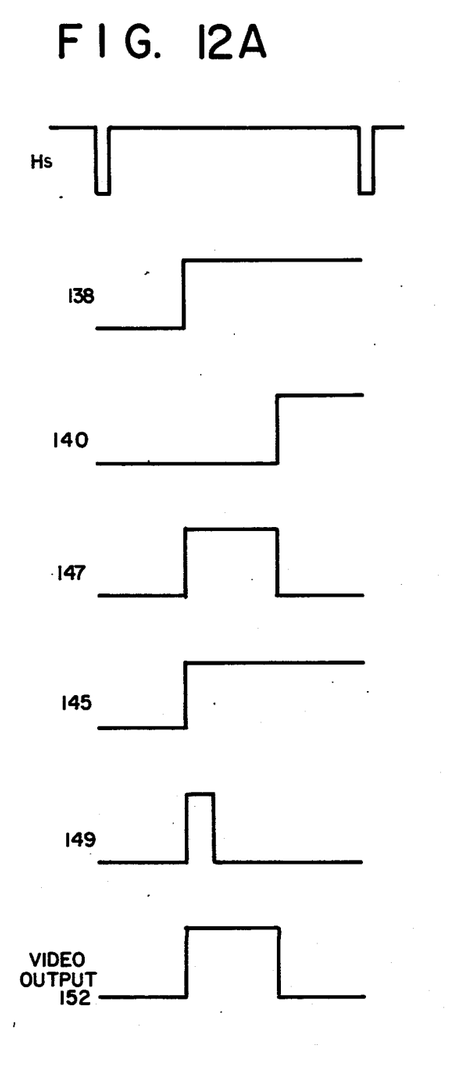
Figure 12B:
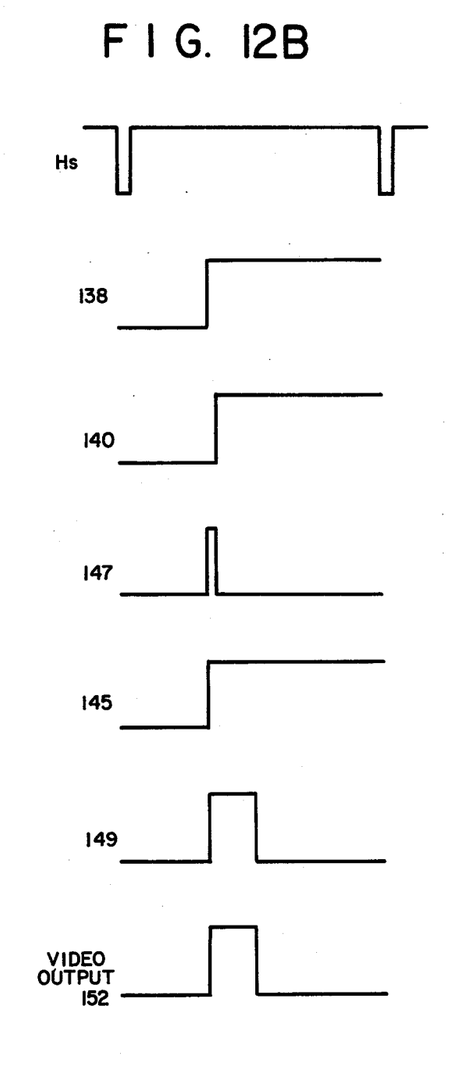

A preferred circuit for establishing a continuous line read display is illustrated in FIG. 11 with typical output waveforms shown in FIGS. 12a and 12b. This circuit is also intended to serve as an alternative to the analog to video converter circuit 52 shown in FIG. 2 with a separate one to be used with each video channel 1-N. The continuous line read display circuit is composed of two conventional comparators indicated as 92 and 94 which are used to compare successively applied sampled signals 110 with a ramp signal generated from the sawtooth generator 130. The ramp signal generated by the sawtooth generator 130 is initiated by the trailing edge of each horizontal sync pulse Hs and terminated by its leading edge in a manner similar to the operation described in the analog to video converter circuit 52. The horizontal sync pulse Hs is also used to control flip-flop 132 which is in turn used to alternately open and close switches 134 and 136 respectively. Switches 134 and 136 are each fast responding solid state field effect transistor switches equivalent to that used in the sample and hold digital filter circuit 42 shown in FIG. 5. The capacitor Ca associated with switch 134 is used to hold the level of the sampled signal 110 applied to comparator A during the switching interval of time when switch 134 is open. Likewise, capacitor Cb, which is preferably equal to capacitor Ca, is used to hold the level of the sampled signal applied to comparator B during the switching interval of time when switch 136 is open. Accordingly, comparitors 92 and 94 will provide comparative output pulses 138 and 140 for each horizontal sync pulse Hs, representative of the point of coincidence for each of two successive sampled signals with each one ramp output of sawtooth generator 130. The output pulse 138 of comparator 92 will begin when the amplitude of the applied sampled signal 110 intersects the ramp output from sawtooth generator 130. Likewise, comparator 94 will generate an output signal 140 when the amplitude of the sampled signal applied to it, representing the previous sampled signal stored by capacitor Cb, intersects the ramp signal of sawtooth generator 130. FIGS. 12a and 12b illustrate the output waveforms at two different scan intervals of time. FIG. 12a illustrates the case where two successive sampled signals are of substantially different magnitude resulting in a significant time displacement between the outputs 138 and 140 respectively, whereas in FIG. 12B the sampled signals are close in magnitude producing little time displacement.

The outputs 138 and 140 of comparators 92 and 94 are applied simultaneously to an OR circuit 142 and to an Exclusive OR circuit 144 respectively. The output 145 of the OR circuiit 142 is initiated in coincidence with the output 138 of comparator 92 and extends for a duration equal to the longer of outputs 138 and 140. The output 147 of the Exclusive OR circuit 144 will also provide an output in coincidence with the output 138 of comparator A but will extend only for a limited duration until both comparator outputs 138 and 140 are present. The output 145 of the OR circuit 142 triggers a monostable multivibrator 148 which has a fixed pulse width output 149 of predetermined duration. An output OR circuit 150 generates a video output signal 152, corresponding to the counterpart output signal 54 of FIG. 2, which will extend for the duration of the output 149 from either monostable multivibrator 148 or the output 147 of the Exclusive OR 144 whichever is longer. This assures a minimum output video pulse width equal to the time period of the output 149 of the monostable multivibrator 148 and a maximum output video pulse width equal to the time difference between the outputs 138 and 140 from comparators 92 and 94 respectively.

What is claimed is:

1. A method for generating an oscillographic display of at least one periodic or aperiodic input signal upon a standard television receiver with said input signal being generated external of said receiver and being independent of the television receiver raster frequency, comprising the steps of:

storing said input signal in a multiplicity of storage elements with each element being responsive to said input signal at a different moment in time;

initiating said storage in synchronism with said input signal;

controlling the rate at which said input signal is stored in said storage elements independent of the input signal rate;

reading the signals stored in said storage elements at a rate in synchronism with the horizontal synchronization frequency of said television receiver;

converting the read signals into corresponding video signals compatible with said television receiver; and displaying said video signals.

2. A method as defined in claim 1 wherein said controlled rate is variable for adjusting the time scale of the input signal display upon the television receiver.

3. A method as defined in claim 2 further comprising the steps of generating a video color signal simultaneously with each video signal and generating a background color signal during the absence of each video color signal.

4. A method as defined in claim 3 further comprising the steps of generating a first plurality of video signals at a first fixed frequency proportional to a multiple of the horizontal synchronization rate for said standard television receiver and generating a second plurality of video signals at a second fixed frequency proportional to a fraction of the horizontal synchronization rate whereby said first and second plurality of video signals form a display graticule.

5. A method as defined in claim 4 further comprising generating graticule video color signals corresponding to said first and second plurality of video signals and displaying said graticule color signals during the time interval when said first and second plurality of video signals are being displayed.

6. A method as defined in claim 4 wherein said conversion of signals to corresponding video signals comprises the steps of:

generating a ramp signal having a period equal to the horizontal synchronization period for said standard television receiver;

sequentially comparing each read signal with each ramp signal; and generating a video signal during each comparison at an instant in time when the magnitude of the signal equals the magnitude of said ramp signal.

7. A method as defined in claim 4 wherein said conversion of read signals to corresponding video signals comprises the steps of:

generating a ramp signal in synchronism with the horizontal synchronization pulse of said standard television receiver;

comparing the magnitude of two successive read signals with said ramp signal;

generating a first output signal when the magnitude of one of said two successive read signals equals the magnitude of said ramp signal;

generating a second output signal when the magnitude of the other said read signals equals the magnitude of said ramp signal;

generating a pulse of predetermined duration at the earliest inception of said first and second read signal generating a video signal coincident in time with said pulse and of a duration equal to the greater of said predetermined pulse duration and the time difference between said first and second read signals.

8. A system for generating an oscillographic display of at least one period of aperiodic input signal upon a standard television receiver with said input signal being generated external of said receiver and being independent of the television receiver raster frequency comprising:

a storage medium containing a multiplicity of storage elements;

means for storing said input signal in said storage elements with each element being responsive to said input signal at a different moment in time;

means for controlling the rate of storage of said input signal in said storage elements:

means for triggering the initiation of said storage in synchronism with said input signal;

means for consecutively reading the signals stored in said storage elements at a rate in synchronism with the horizontal synchronization frequency of said television receiver;

means for converting the read signals into corresponding video signals compatible with said television receiver; and means for displaying said video signals.

9. A system as defined in claim 8 further comprising clock means responsive to the triggering of said storage for generating clock pulses at a given rate and wherein said means for controlling said storage rate includes means for varying said clock pulse rate.

10. A system as defined in claim 9 wherein said means for storing said input signal is a sample and hold circuit including a multiplicity of switch means and storage capacitors and further comprising write commutator means for sequentially controlling each of said switch means in response to said clock pulses over a predetermined commutation period.

11. A system as defined in claim 10 further comprising means for converting said stored input signals into corresponding digital signals; memory means; means for storing said digital signals into said memory means; means for retrieving the digital signals from said memory means and means for converting said digital signals to analog signals.

12. A system as defined in claim 10 further comprising:

means for receiving a multiple number of separate input signals;

means for converting each of said separate input signals into corresponding video signals;

means for generating a corresponding video color signal simultaneously with each video signal; and means for generating a background color signal during the absence of each video color signal.

13. A system as defined in claim 12 further comprising means for adjusting the hue and saturation of each of said video color signals and of said background color signal.

14. A system as defined in claim 13 further comprising means for generating a master clock signal, means for dividing the master clock signal into a first plurality of video signals at a rate proportional to a multiple of the horizontal synchronization rate;

means for further dividing the master clock signal into a second plurality of video signals at a rate proportional to a fraction of the horizontal synchronization rate; and means for generating corresponding video color signals for said first and second plurality of video signals.

15. A television oscilloscope as defined in claim 14 further comprising digital memory means and means for transferring each of the stored sampled signals to said digital memory means;

said digital memory means including means for converting the stored analog signals to digital signals and means responsive to a command instruction for reconverting said digital signals back to analog signals.

16. A television oscilloscope for examining at least one periodic or aperiodic input signal generated from a source external thereof, comprising; in combination, within a single housing, a standard TV receiver including color demodulation means and vertical and horizontal deflection means, and means for generating an oscillographic display of said input signals upon said receiver, said generating means comprising:

a storage medium containing a multiplicity of storage elements;

means for storing said input signal in said storage elements with each element being responsive to said input signal at a different moment in time;

means for adjustably controlling the rate of storage of said input signal in said storage elements;

means for triggering the initiation of said storage in synchronism with said input signal;

means for consecutively reading the signals stored in said storage elements at a rate in synchronism with the horizontal synchronization frequency of a standard TV receiver;

means for converting the read signals into TV video signals;

means for generating pulses at the horizontal synchronization frequency of a standard TV receiver;

means for generating pulses at the vertical synchronization frequency of a standard TV receiver;

means for applying said video signals to said color demodulation means; and means for applying said horizontal and vertical synchronization pulses to said horizontal and vertical deflection means respectively.

* * * * *